(12) United States Patent
Dieu et al.

(10) Patent No.: US 7,056,623 B2
(45) Date of Patent: Jun. 6, 2006

(54) PHOTOMASK AND METHOD FOR MANUFACTURING THE SAME

(75) Inventors: Laurent Dieu, Austin, TX (US); Franklin Dean Kalk, Austin, TX (US)

(73) Assignee: Toppan Photomasks, Inc., Round Rock, TX (US)

( * ) Notice: Subject to any disclaimer, the term of this patent is extended or adjusted under 35 U.S.C. 154(b) by 208 days.

(21) Appl. No.: 10/350,876

(22) Filed: Jan. 24, 2003

(65) Prior Publication Data

US 2003/0138707 A1 Jul. 24, 2003

Related U.S. Application Data

(60) Provisional application No. 60/355,699, filed on Feb. 7, 2002, provisional application No. 60/351,533, filed on Jan. 24, 2002.

(51) Int. Cl.
*G03F 9/00* (2006.01)

(52) U.S. Cl. .............................. 430/5; 430/14; 430/330; 427/314; 427/372.2

(58) Field of Classification Search .................... 430/5, 430/330, 14; 428/14; 427/314, 372.2
See application file for complete search history.

(56) References Cited

U.S. PATENT DOCUMENTS

| 5,372,901 A | * | 12/1994 | Rolfson et al. ................. 430/5 |
| 5,622,787 A |   | 4/1997  | Sakata et al. ................ 428/620 |
| 5,700,603 A |   | 12/1997 | Lee ................................. 430/5 |
| 5,738,909 A | * | 4/1998  | Thakur et al. ............ 427/255.4 |
| 5,792,578 A | * | 8/1998  | Tzu et al. ........................ 430/5 |
| 6,197,454 B1 |  | 3/2001  | Yan ................................. 430/5 |
| 6,228,540 B1 |  | 5/2001  | Kobayashi ...................... 430/5 |
| 6,242,136 B1 |  | 6/2001  | Moore et al. ................... 430/5 |
| 6,255,225 B1 |  | 7/2001  | Yamada et al. ............. 438/725 |
| 6,558,855 B1 | * | 5/2003  | Tanaka et al. ................. 430/5 |

OTHER PUBLICATIONS

International Search Report PCT/US 03/02281.

* cited by examiner

*Primary Examiner*—Christopher G. Young
(74) *Attorney, Agent, or Firm*—Baker Botts L.L.P.

(57) ABSTRACT

A photomask and method for manufacturing the same are disclosed. A first material is deposited on at least a portion of a substrate to form a first material layer. Before completion of the deposition of the first material, a thermal treatment is applied to the substrate at a temperature greater than approximately 300 degrees Celsius.

23 Claims, 2 Drawing Sheets

US 7,056,623 B2

PHOTOMASK AND METHOD FOR MANUFACTURING THE SAME

CROSS-REFERENCE TO RELATED APPLICATION

This application claims priority from U.S. Provisional Patent Application Ser. No. 60/351,533, filed Jan. 24, 2002, and entitled "Photomask Blank and Method for Manufacturing the Same" and U.S. Provisional Patent Application Ser. No. 60/355,699, filed Feb. 7, 2002, and entitled "Photomask Blanks and Method for Manufacturing the Same".

TECHNICAL FIELD OF THE INVENTION

This invention relates in general to the field of photolithography and, more particularly, to a photomask and method for manufacturing the same.

BACKGROUND OF THE INVENTION

As semiconductor device manufacturers continue to produce smaller devices, the requirements for photomasks used in the fabrication of these devices continue to tighten. Photomasks, also known as reticles or masks, typically consist of substrates (e.g., high-purity quartz or fused silica) that have an absorber layer (e.g., chrome or molybdenum silicide) formed on the substrate. The absorber layer includes a pattern representing a circuit image that may be transferred onto semiconductor wafers in a lithography system. As feature sizes of semiconductor devices decrease, the corresponding circuit images on the photomask also become smaller and more complex. Consequently, the quality of the mask has become one of the most crucial elements in establishing a robust and reliable semiconductor fabrication process.

Today, semiconductor manufacturers are searching for techniques to extend the use of optical lithography for manufacturing high-density ICs with critical dimensions of less than 130 nm. As feature sizes decrease, however, resolution for imaging a minimum feature size on the wafer with a particular exposure wavelength is limited by the diffraction of the light. Therefore, a shorter exposure wavelength, e.g., less than 400 nm, is required to image finer features on the wafer. Wavelengths targeted for future generations of optical lithography include 248 nm (KrF laser wavelength), 193 nm (ArF laser wavelength), and 157 nm ($F_2$ laser wavelength).

At wavelengths below 400 nm, flatness of the photomask blank and resulting photomask is a concern. Any change in the flatness may result in registration errors in a semiconductor manufacturing process. Since a large number of photomasks (e.g., up to 50 for advanced designs) may be used to create a single integrated circuit, registration errors on a single photomask should be kept to a minimum. Although tool accuracy may contribute to registration error, it has been demonstrated that the stress of the absorber layer may cause the substrate to warp and thus, create registration errors.

One technique for reducing the stress of the absorber layer includes annealing a photomask blank after the absorber layer has been formed on the substrate. This technique, however, has a number of disadvantages. First, the annealing is performed after the absorber layer is formed on the substrate, which adds a step and additional time to a photomask manufacturing process. Second, heat used during the annealing process modifies optical properties associated with the absorber layer, which is undesirable if a specific transmission and/or phase shift is desired.

SUMMARY OF THE INVENTION

In accordance with the teachings of the present invention, the disadvantages and problems associated with manufacturing a photomask have been substantially reduced or eliminated. In a particular embodiment, a method for manufacturing a photomask includes applying a thermal treatment at a temperature greater than approximately 300 degrees Celsius before completing the deposition of a material used to form a material layer on a substrate.

In accordance with one embodiment of the present invention, a method for manufacturing a photomask includes depositing a first material on at least a portion of a substrate to form a first material layer. A thermal treatment is applied to the substrate at a temperature greater than approximately 300 degrees Celsius before completing the deposition of the first material on the substrate.

In accordance with another embodiment of the present invention, a method for manufacturing a photomask includes depositing at least one material on at least a portion of a substrate using ion beam deposition to form at least one material layer. A thermal treatment that reduces stress in the material layer is applied to the substrate at a temperature greater than approximately 300 degrees Celsius during deposition of the material on the substrate.

In accordance with a further embodiment of the present invention, a photomask assembly includes a pellicle assembly formed in part by a pellicle film attached to a pellicle frame and a photomask coupled to the pellicle assembly opposite the pellicle film. The photomask includes a patterned layer formed on a substrate by depositing at least one material on at least a portion of a substrate to form the patterned layer. During deposition of the material on the substrate, a thermal treatment that reduces stress in the patterned layer is applied at a temperature greater than approximately 300 degrees Celsius.

Important technical advantages of certain embodiments of the present invention include a deposition technique that prevents a photomask substrate from warping. Before completion of a deposition process, a thermal treatment is applied to a substrate. The thermal treatment reduces an inherent stress present in the material layer, which reduces the overall stress in the photomask and prevents the photomask from warping.

Another technical advantage of certain embodiments of the present invention includes a deposition technique that reduces the potential for registration errors in a semiconductor manufacturing process. During a fabrication process for a photomask blank, a thermal treatment is applied to a substrate in order to reduce the inherent stress in the material. The amount of substrate curvature caused by the material layer is reduced since the material layer has less stress. Therefore, the possibility that registration errors may occur when forming an IC on a surface of a wafer is also reduced since the flatness of the photomask is maintained.

A further important technical advantage of certain embodiments of the present invention includes a deposition technique that reduces the number of unwanted particles deposited on the surface of a substrate. By applying a heat treatment to the substrate, a temperature gradient is formed between the walls of a deposition tool and the substrate. The heated substrate repels unwanted particles, which allows a layer of material that has a low defect density to be formed on the substrate.

All, some, or none of these technical advantages may be present in various embodiments of the present invention. Other technical advantages will be readily apparent to one skilled in the art from the following figures, descriptions, and claims.

BRIEF DESCRIPTION OF THE DRAWINGS

A more complete and thorough understanding of the present embodiments and advantages thereof may be acquired by referring to the following description taken in conjunction with the accompanying drawings, in which like reference numbers indicate like features, and wherein.

DETAILED DESCRIPTION OF THE INVENTION

Preferred embodiments of the present invention and their advantages are best understood by reference to FIGS. 1 through 6, where like numbers are used to indicate like and corresponding parts.

Figure 1:
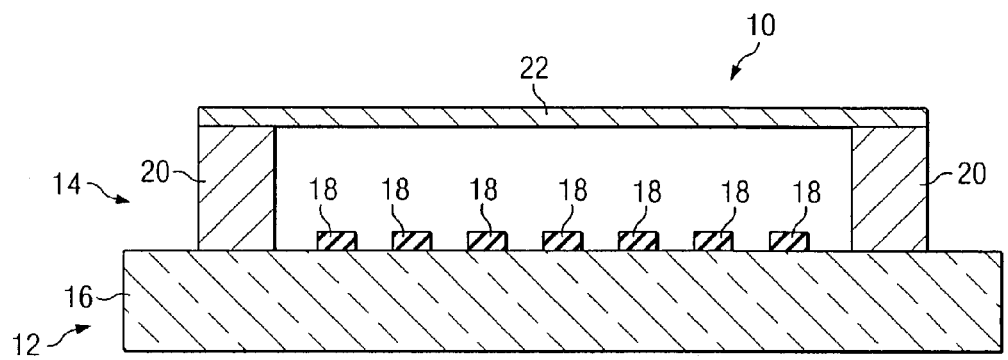
FIG. 1 illustrates a cross-sectional view of a photomask assembly including a photomask fabricated from a photomask blank in accordance with the teachings of the present invention.

FIG. 1 illustrates a cross-sectional view of photomask assembly 10. In the illustrated embodiment, photomask assembly 10 includes photomask 12 coupled to pellicle assembly 14. Substrate 16 and patterned layer 18 form photomask 12, otherwise known as a mask or reticle, that may have a variety of sizes and shapes, including but not limited to round, rectangular, or square. Photomask 12 may also be any variety of photomask types, including, but not limited to, a one-time master, a five-inch reticle, a six-inch reticle, a nine-inch reticle or any other appropriately sized reticle that may be used to project an image of a circuit pattern onto a semiconductor wafer. Photomask 12 may further be a binary mask, a phase shift mask (PSM), an optical proximity correction (OPC) mask or any other type of mask suitable for use in a lithography system.

Photomask 12 includes patterned layer 18 formed on substrate 16 that, when exposed to electromagnetic energy in a lithography system, projects a pattern onto a surface of a semiconductor wafer (not expressly shown). For some applications, substrate 16 may be a transparent material such as quartz, synthetic quartz, fused silica, magnesium fluoride ($MgF_2$), calcium fluoride ($CaF_2$), or any other suitable material that transmits at least seventy-five percent (75%) of incident light having a wavelength between approximately 10 nanometers (nm) and approximately 450 nm. In an alternative embodiment, substrate 16 may be a reflective material such as silicon or any other suitable material that reflects greater than approximately fifty percent (50%) of incident light having a wavelength between approximately 10 nm and 450 nm.

Patterned layer 18 may be a metal material such as chrome, chromium nitride, a metallic oxy-carbo-nitride (M—O—C—N), where the metal is selected from the group consisting of chromium, cobalt, iron, zinc, molybdenum, niobium, tantalum, titanium, tungsten, aluminum, magnesium and silicon, or any other suitable material that absorbs electromagnetic energy with wavelengths in the ultraviolet (UV) range, deep ultraviolet (DUV) range, vacuum ultraviolet (VUV) range and extreme ultraviolet range (EUV). In an alternative embodiment, patterned layer 18 may be a partially transmissive material, such as a compound of molybdenum silicide (MoSi), which has a transmissivity of approximately one percent (1%) to approximately thirty percent (30%) in the UV, DUV, VUV and EUV ranges.

Frame 20 and pellicle film 22 may form pellicle assembly 14. Frame 20 is typically formed of anodized aluminum, although it could alternatively be formed of stainless steel, plastic or other suitable materials that do not degrade or outgas when exposed to electromagnetic energy within a lithography system. Pellicle film 22 may be a thin film membrane formed of a material such as nitrocellulose, cellulose acetate, an amorphous fluoropolymer, such as TEFLON® AF manufactured by E. I. du Pont de Nemours and Company or CYTOP® manufactured by Asahi Glass, or another suitable film that is transparent to wavelengths in the UV, DUV, EUV and/or VUV ranges. Pellicle film 22 may be prepared by a conventional technique such as spin casting.

Pellicle film 22 protects photomask 12 from contaminants, such as dust particles, by ensuring that the contaminants remain a defined distance away from photomask 12. This may be especially important in a lithography system. During a lithography process, photomask assembly 10 is exposed to electromagnetic energy produced by a radiant energy source within the lithography system. The electromagnetic energy may include light of various wavelengths, such as wavelengths approximately between the I-line and G-line of a Mercury arc lamp, or DUV, VUV or EUV light. In operation, pellicle film 22 is designed to allow a large percentage of the electromagnetic energy to pass through it. Contaminants collected on pellicle film 22 will likely be out of focus at the surface of the wafer being processed and, therefore, the exposed image on the wafer should be clear. Pellicle film 22 formed in accordance with the teachings of the present invention may be satisfactorily used with all types of electromagnetic energy and is not limited to lightwaves as described in this application.

Photomask 12 may be fabricated from a photomask blank. In one embodiment, the photomask blank may include at least one layer of opaque or partially transmissive material formed on a substrate. The material may be deposited on substrate 16 using physical vapor deposition (PVD), chemical vapor deposition (CVD), ion beam deposition (IBD) or any other suitable deposition technique. In a conventional deposition process, an inherent stress in the deposited material may cause the flatness of the substrate to degrade, thus causing the substrate to warp. This warping may cause registration errors in a semiconductor manufacturing process, which may impair the performance of the ICs being fabricated. In one embodiment, a thermal or heat treatment may be applied to the substrate in order to reduce the stress in the deposited material. The thermal treatment, therefore, may prevent the substrate from warping and reduce the potential for registration errors in a semiconductor manufacturing process. The thermal treatment may additionally create a temperature gradient between the substrate and the walls of the deposition tool such that the heated substrate repels contaminants.

Photomask 12 may be formed from the thermal treated photomask blank using a standard lithography process. In a lithography process, a mask pattern file that includes data for patterned layer 18 may be generated from a mask layout file. The mask layout file may include polygons that represent transistors and electrical connections for an integrated circuit. The polygons in the mask layout file may further represent different layers of the integrated circuit when it is fabricated on a semiconductor wafer. For example, a transistor may be formed on a semiconductor wafer with a diffusion layer and a polysilicon layer. The mask layout file, therefore, may include one or more polygons drawn on the diffusion layer and one or more polygons drawn on the polysilicon layer. The polygons for each layer may be converted into a mask pattern file that represents one layer of the integrated circuit. Each mask pattern file may be used to generate a photomask for the specific layer.

The desired pattern may be imaged into a resist layer of the photomask blank using a laser, electron beam or X-ray lithography system. In one embodiment, a laser lithography system uses an Argon-Ion laser that emits light having a wavelength of approximately 364 nanometers (nm). In alternative embodiments, the laser lithography system uses lasers emitting light at wavelengths from approximately 150 nm to approximately 300 nm. Photomask 12 may be fabricated by developing and etching exposed areas of the resist layer to create a pattern, etching the portions of patterned layer 18 not covered by resist, and removing the undeveloped resist to create patterned layer 18 over substrate 16.

Figure 2A:
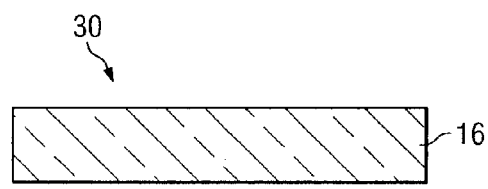
FIGS. 2A–2C illustrate cross-sectional views at various stages of a manufacturing process for a photomask blank in accordance with the teachings of the present invention.
Figure 2B:
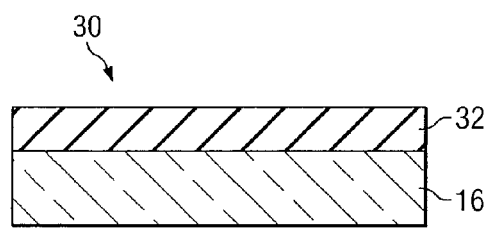
Figure 2C:
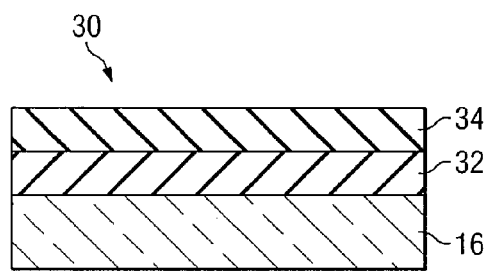

FIGS. 2A through 2C illustrate cross-sectional views of photomask blank 30 during various stages of a photomask blank fabrication process. In FIG. 2A, substrate 16 is provided. As described above in reference to FIG. 1, substrate 16 may be a transparent material, such as quartz, synthetic quartz, fused silica, $MgF_2$ or $CaF_2$, or a reflective material, such as silicon. In FIG. 2B, material layer 32 is formed on substrate 16. In one embodiment, photomask blank 30 may be used to fabricate a binary photomask. In this example, material layer 32 may be a metallic oxy-carbo-nitride ($M_aO_bC_cN_d$) where M is a metal selected from Groups IV, V and IV and b, c and d vary between 0 and 1 and a=1−(b+c+d), or any suitable material that provides sufficient light attenuation and produces an optical density of at least two when the thickness of the material is adjusted with the associated optical properties of the material (e.g., n and k). Material layer 32 may be deposited in a homogenous, graded or multi-layer form.

In another embodiment, photomask blank 30 may be used to fabricate a phase shift mask (PSM), including, but not limited to, an alternating PSM, an attenuated PSM, and a multi-tone PSM. In this example, material layer 32 may be a homogeneous or graded structure of $MSi_xO_yN_z$ where M is a metal selected from Groups IV, V or VI, and where x+y+z=1 or a multi-layer structure of $M_1O_aN_b/M_2O_cN_d$ where $M_1$ is either aluminum (Al) or silicon (Si), $M_2$ is a metal selected from Groups IV, V or IV, and a varies between 0 and 1, b varies between 0 and 1−a, c varies between 0 and 1 and d varies between 0 and 1−c. The multi-layered structure may be a combination of the above materials such that at least one layer is opaque to the exposure wavelength and the other layer is partially transmissive to the exposure wavelength.

Material layer 32 may be deposited using PVD, CVD, IBD or any other suitable deposition technique. If an IBD process is used, material layer 32 may have a higher density than a material formed by other sputtering methods. Material layer 32 may also have a high inherent stress because particles being deposited or particles used in the sputtering gas have high energies. These high-energy particles create material layer 32 on substrate 16 that may have a high compressive stress, which results in a layer that has a high stress.

In one embodiment, the stress in material layer 32 may be reduced by applying a thermal treatment to substrate 16 before completion of the deposition process. The thermal treatment may be applied through radiation, convection, conduction or any other technique that enables material layer 32 and/or substrate 16 to be heated above a certain temperature. The treatment may be applied continuously or intermittently in order to achieve a temperature of approximately 300 degrees Celsius (e.g., approximately 600 Kelvin) or higher. The thermal treatment has the advantage that the optical properties of material layer 32 are determined during the deposition since the treatment is applied before the deposition of material layer 32 is complete.

In one embodiment, the thermal treatment may be applied to substrate 16 before the deposition process begins. Once substrate 16 reaches the appropriate temperature, substrate 16 may be placed in a deposition tool. Substrate 16 maintains the appropriate temperature in the deposition tool since a vacuum in the tool prevents heat from dissipating from substrate 16. In another embodiment, the thermal treatment may be applied to substrate 16 during the deposition process. In addition, the thermal treatment may also heat the material being deposited on substrate 16. In a further embodiment, the thermal treatment may be applied both before and during the deposition process to ensure that substrate 16 remains at an appropriate temperature to reduce stress in material layer 32 and repel unwanted particles from being including in material layer 32.

As shown by the following formula, thermal stress ($S_{thermal}$) in photomask 12 may be used to counteract the intrinsic stress of the deposited film and therefore reduce the warp of the photomask 12 if substrate 16 and/or material layer 32 are heated during deposition.

$$S_{thermal} = (\alpha_F - \alpha) \times E_F \times \Delta T$$

$\alpha_F$ and $\alpha$ are the average coefficient of expansion for material layer 32 and substrate 16 respectively, $E_F$ is the Young's Modulus of material layer 32 and $\Delta T$ is the temperature of substrate 16 during deposition minus the temperature of substrate 16 at measurement.

As shown by the formula below, a reduction of the intrinsic stress in material layer 32 increases the radius of curvature (R) of substrate 16, which improves the registration of photomask 12 formed from photomask blank 30 during a lithography process.

$$R = \frac{1}{6\sigma_f} * \frac{E_s d_s^2}{(1 - \nu_s) * d_f}$$

$\sigma_f$ is the intrinsic stress in material layer 32, $E_s$ is the Young's Modulus of substrate 16, $\nu_s$ is the Poisson ratio of substrate 16, $d_f$ is the thickness of material layer 32 and $d_s$ is the thickness of substrate 16.

Based on the above formulas, temperatures of greater than approximately 300 degrees Celsius (e.g., approximately 600 Kelvin) may effectively reduce the stress in material layer 32 and thus, prevent the flatness of substrate 16 from degrading without altering any optical properties of photomask blank 30.

A thermal treatment applied during deposition may also create a thermophoresis effect in the deposition tool that occurs when a temperature gradient is present, which creates asymmetrical interactions between a particle being deposited to form material layer 32 and surrounding gas molecules. In other words, the thermophoretic effect caused by the temperature gradient causes particles to be repelled from a heated surface and attracted to a cold surface. By heating substrate 16, the walls of the deposition chamber will be colder than the surface of substrate 16 and extra particles will be repelled from the surface of substrate 16. This effect may also counteract other forces acting on particles during the deposition process, such as gravity and fluid momentum, and provide for a much cleaner deposited material layer. Material layer 32, therefore, may have a low defect density since unwanted particles (e.g., contaminants that may be present in the deposition tool) are repelled from substrate 16 and material layer 32.

As shown in FIG. 2C, photomask blank 30 is completed by forming resist layer 34 over material layer 32. Although FIGS. 2B and 2C illustrate photomask blank 30 with a single layer of material, two or more layers of material may be formed such that a subsequent layer is formed on the previous layer. Resist layer 34 may then be formed on upper most layer of material. Photomask 12 may then be fabricated from photomask blank 30 using a standard lithography process.

Figure 3:
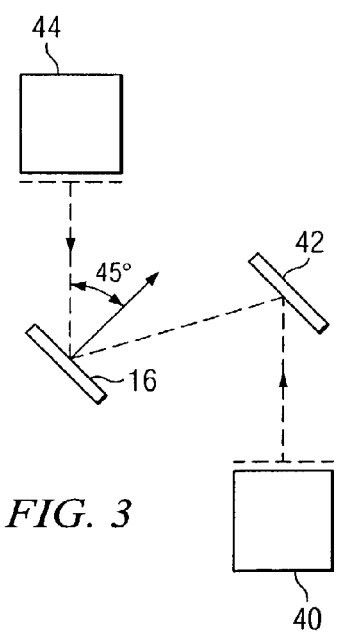
FIG. 3 illustrates an ion-beam deposition apparatus used to deposit material on a substrate in accordance with the teachings of the present invention.

FIG. 3 illustrates an ion beam deposition (IBD) apparatus that may be used to deposit material layer 32. In an IBD process, a plasma discharge, otherwise known as an ion gun or source, is contained in a chamber and ions are extracted and accelerated by an electric potential impressed on a series of grids at the exit port of the ion gun. The IBD process has numerous advantages over other deposition processes that use sputtering to deposit a material from a target on a surface. First, the IBD process provides a cleaner process (e.g., fewer unwanted particles) at the deposition surface of a substrate because the plasma that might otherwise trap and transport charged particles to the substrate is not in the proximity of a material layer formed on the substrate. Second, the IBD process operates at a lower total gas pressure, which results in reduced levels of chemical contamination. Third, the IBD process also has the ability to independently control the deposition flux, and the reactive gas ion flux (current) and energy. Finally, in a dual IBD process the angles between a material target, the substrate and the ion guns can be adjusted to optimize for film uniformity and film stress.

In a single IBD process, an energized beam of ions (usually neutralized by an electron source) is directed from deposition gun 40 to target 42 located on a target holder (not expressly shown). Material from target 42 is sputtered when the bombarding ions from deposition gun 40 have energies above a sputtering threshold energy for that specific target material. In one embodiment, the threshold energy may be approximately 50 eV.

The ions from deposition gun 40 may be from an inert gas source such as He, Ne, Ar, Kr, Xe, although reactive gases such as $O_2$, $N_2$, $CO_2$, $F_2$, $CH_3$, or combinations thereof, may also be used. When these ions are from an inert gas source, material from target 42 is sputtered and deposited as material layer 32 on substrate 16. When these ions are produced by a reactive gas source, the ions may combine with material from target 42 and the product of this chemical combination is sputtered and deposited as material layer 32 on substrate 16. In one embodiment, the bombarding ions may have energies between approximately 200 eV and approximately 10 KeV, and the ion flux or current may be greater than approximately $10^{13}$ ions/cm$^2$/s in order to maintain practical deposition rates (e.g., greater than 0.1 nm/min). The process pressure within the chamber may be between approximately $10^{-3}$ and approximately $10^{-5}$ Torr. Target 42 may consist of an elemental material, such as Si, Ti, Mo, Cr, or the material may be a compound, such as $Mo_xSi_y$, or $SiO_2$, where x is between approximately 0 and approximately 0.7, and y=(1−x). Substrate 16 may be positioned at a distance and an orientation to target 42 that optimizes film properties such as thickness and uniformity, and minimizes stress.

In a dual IBD process, ions from assist gun 44, in addition to ions from deposition gun 40, are neutralized by an electron source and directed towards the surface of substrate 16. In operation, assist gun 44 provides an adjustable flux of low energy ions (e.g., below approximately 100 eV) that react with the sputtered atoms from target 42 at the surface of substrate 16 to form material layer 32. The ions from assist gun 44 may originate from a reactive gas source such as $O_2$, $N_2$, $CO_2$, $N_2O$, $H_2O$, $NH_3$, $CF_4$, $CHF_3$, $F_2$, $CH_4$ or $C_2H_2$, an inert gas such as Ne, Ar, Kr, Xe, or combinations thereof. In one embodiment, the energy of ions from assist gun 44 may be lower than the energy of ions from deposition gun 40.

Typically, a dual IBD process is used to fabricated more complicated structures that may be useful to form phase shift masks for lithography at exposure wavelengths in the DUV, VUV and EUV ranges and that produce a phase shift of approximately 180°. For example, multiple layers of $SiN_x$ and $TiN_y$, where x is in the range from approximately 1.0 to approximately 1.3 and y is approximately 1.0, may be formed by alternately depositing elemental Si and Ti from the respective targets while substrate 16 is being bombarded by reactive nitrogen from assist gun 44. A single IBD process, however, may also be used to deposit complicated structures by using a beam voltage of approximately 800 V. For example, either a single or dual IBD process may be used to deposit materials including, but not limited to, $Si_3N_4$, TiN, and multi-layers of compound materials such as $Si_3N_4$/TiN, $Ta_2O_5$/$SiO_2$, $SiO_2$/TiN, $Si_3N_4$/$SiO_2$ or $CrF_3$/$AlF_3$.

A single or dual IBD process may also be used to deposit material layer 32 in the form of a structure having alternating optically absorbing layers and optically transmitting layers. The absorbing component may be characterized by an extinction coefficient k>0.1 (e.g., from approximately 0.5 to approximately 3.5) for wavelengths less than approximately 400 nm, while the transmitting component may be characterized by an extinction coefficient k<<1.0 for wavelengths less than approximately 400 nm. The refractive index of the absorbing component may be in the range from approximately 0.5 to approximately 3.0 for wavelengths below 400 nm and the refractive index of the transmitting component may be in the range from approximately 1.2 to approximately 3.5 for the same wavelengths.

The optically transmitting components of material layer 32 may be selected from a suitable metal oxide, metal nitride, or metal fluoride, and optically transmitting forms of carbon. The oxide based optically transmitting components of material layer 32 may be selected from oxides with an optical bandgap energy of greater than about 3 eV, including but not limited to, oxides of Si, Al, Ge, Ta, Nb, Hf, and Zr. The nitride based optically transmitting components of material layer 32 may be selected from nitride materials with an optical bandgap energy of greater than approximately 3 eV, including but not limited to, nitrides of Al, Si, B and C. The fluoride based optically transmitting components of material layer 32 may be selected from materials such as fluorides with an optical bandgap energy of greater than approximately 3 eV, including but not limited to, fluorides of group II elements or the lanthanide elements (e.g., elements having atomic numbers between 57 and 71). The optically transmitting carbon may include a carbon having a diamond structure, sometimes referred to as carbon with $sp^3$ C—C bonding, and also known as diamond-like carbon (DLC). Because of its wide range of optical properties, DLC can function either as the absorbing or transmitting layer. A combination of one or more of the oxides, fluorides, nitrides, and DLC may also be deposited with the single or dual IBD processes.

The optically absorbing components of material layer 32 may be selected from elemental metals, metal nitrides, oxides and any combination thereof. The oxide based optically absorbing components of material layer 32 may be selected from materials with optical bandgap energy less than that of the transmitting component of material layer 32, including but not limited to, oxides from groups IIIB, IVB, VB and VIB. The nitride based optically absorbing components of material layer 32 may be selected from materials with optical bandgap energies less than approximately 3 eV, including but not limited to, nitrides of group IIIB, IVB, VB, and VIB. A combination of one or more of metals, oxides, and nitrides may also be deposited with the single or dual IBD processes.

The optically absorbing layers and the optically transmitting layers of material layer 32 may be ion-beam deposited in a periodic or an aperiodic arrangement. In one embodiment, the optically absorbing layers of the film and the optically transparent layers of the film are deposited in an alternating arrangement.

A single or dual IBD process may be also be used to fabricate a binary photomask for lithographic wavelengths of less than approximately 400 nm. For example, an IBD process may be used to deposit a single layer or multiple layers of $MO_xC_yN_z$, where M is selected from chromium, molybdenum, tungsten, or tantalum or any combination thereof, where x ranges from approximately 0 to approximately 3.0, y ranges from approximately 0 to approximately 1.0, and z ranges from approximately 0 to approximately 2.0. In one embodiment, the $MO_xC_yN_z$ material my have an optical density of greater than approximately two units.

In general, the IBD materials forming material layer 32 may be classified in crystal chemistry architecture as belonging to the class of binary compounds: AX, $AX_2$, $A_2X$, and $A_mX_z$, or combinations thereof, where m and z are integers, and A represents a cation and X represents an anion. Partial chemical substitution on both sites (A, X) is possible, including vacancies, consistent with maintaining chemical neutrality.

Figure 4:
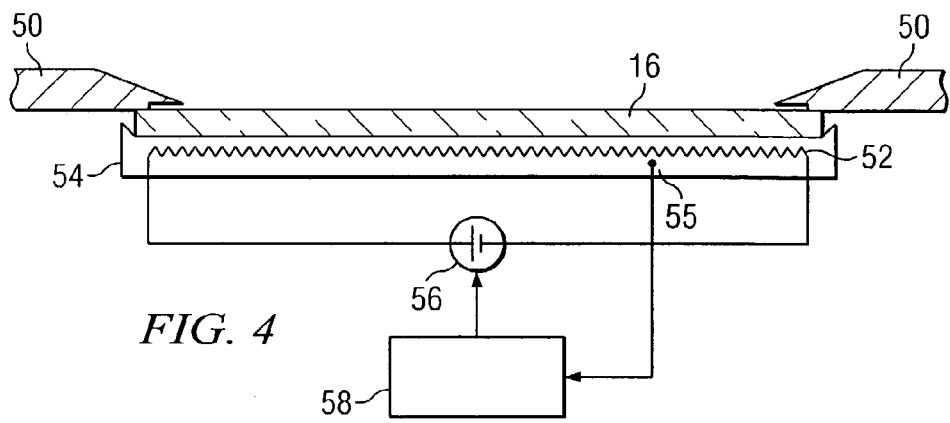
FIG. 4 illustrates an example apparatus used to anneal a material deposited on a substrate through conduction in accordance with the teachings of the present invention.

FIG. 4 illustrates an example apparatus used to anneal material layer 32 before or during deposition on substrate 16 by using conduction. Substrate 16 may be held on its sides by clamping shields 50 that are located on opposite sides of substrate 16. Resistive wire 52 that is placed in hot plate 54 may be coupled to adjustable power generator 56 that is controlled by computer 54. Thermocouple 56 in hot plate 54 may provide temperature feedback to computer 54. The heating process (e.g., thermal treatment) may occur before or during deposition of material layer 32 on substrate 16 in order to reduce the stress in material layer 32.

Figure 5:
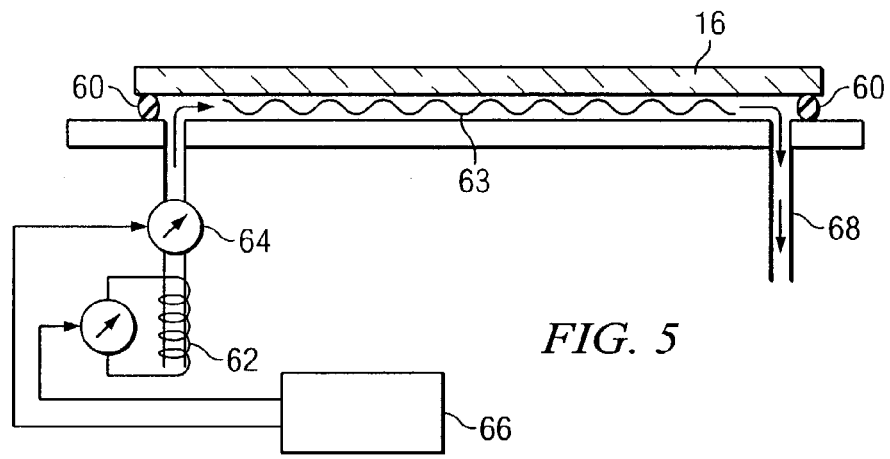
FIG. 5 illustrates an example apparatus used to anneal a material deposited on a substrate through convection in accordance with the teachings of the present invention.

FIG. 5 illustrates an example apparatus used to anneal material layer 32 before or during deposition on substrate 16 by using convection. O-ring 60 that is placed around the perimeter of the bottom surface of substrate 16 may be used to separate substrate 16 from a convection apparatus. Wire coil 62 may be used to heat gas 63 that flows under substrate 16. In one embodiment, gas 63 may be an inert gas, such as He or Ar. In another embodiment, gas 63 may be any suitable gas that provides good thermal transfer characteristics and that will not contaminate material layer 32 by introducing foreign particles into the gas being used in the deposition process. Gas 63 may be released into the convection apparatus by adjustable value 64 that is controlled by computer 66. Gas 63 then passes under substrate 16 and out through exhaust port 68. Gas 63 warms substrate 16 before or during deposition of material layer 32 in order to reduce the intrinsic stress in the material being deposited.

Figure 6:
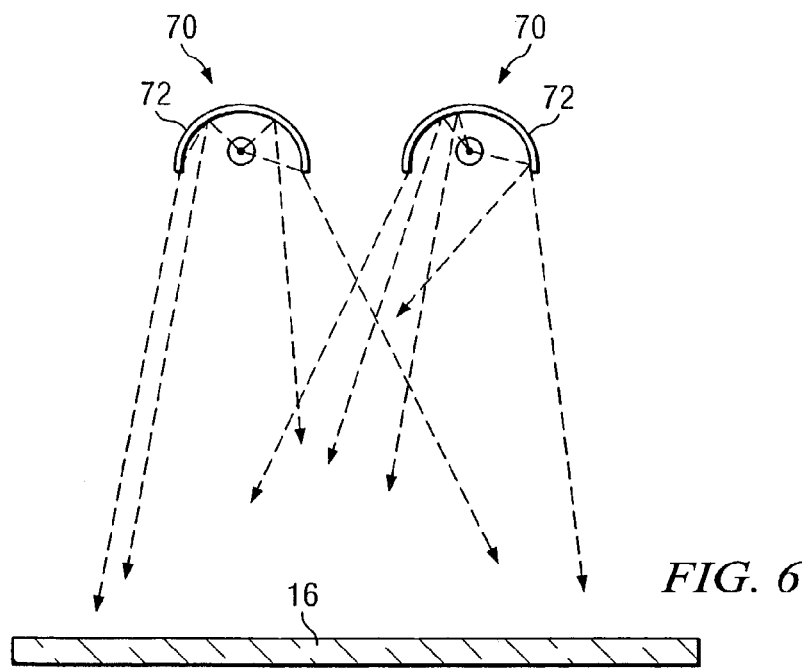
FIG. 6 illustrates an example apparatus used to anneal a material deposited on a substrate through radiation in accordance with the teachings of the present invention.

FIG. 6 illustrates an example apparatus used to anneal material layer 32 before or during deposition on substrate 16 by using radiation. One or more of lamps 70 that provide radiation in the infrared or ultra violet range may be directed towards substrate 16. Lamps 70 may include unfocused reflectors 72 that direct the radiation in the direction of substrate 16. During or before deposition of a material on substrate 16, lamps 70 may be turned on in order to apply a thermal treatment to substrate 16 and reduce the stress in material layer 32. In one embodiment, the lamps may be directed towards the frontside (e.g., the side on which material layer 32 is formed) of substrate 16. In another embodiment, if the lamps use light in the IR range, the lamps may be directed towards the backside of substrate 16.

Although the present invention has been described in detail, it should be understood that various changes, substitutions and alterations can be made thereto without departing from the sphere and scope of the invention as defined by the appended claims.

What is claimed is:

1. A method for manufacturing a photomask blank, comprising:
    depositing a first material on at least a portion of a substrate using a deposition process selected from the group consisting of chemical vapor deposition, physical vapor deposition and ion beam deposition to form a first material layer; and
    applying a thermal treatment to the substrate at a temperature greater than approximately 300 degrees Celsius during deposition of the first material.

2. The method of claim 1, further comprising the thermal treatment operable to reduce stress in the first material layer.

3. The method of claim 1, further comprising applying the thermal treatment before beginning deposition of the first material.

4. The method of claim 1, further comprising the thermal treatment operable to reduce contaminants deposited on the substrate during the deposition of the first material.

5. The method of claim 1, further comprising applying the thermal treatment continuously during deposition of the first material.

6. The method of claim 1, further comprising applying the thermal treatment intermittently during deposition of the first material.

7. The method of claim 1, further comprising applying the thermal treatment by radiation.

8. The method of claim 1, further comprising applying the thermal treatment by convection.

9. The method of claim 1, further comprising applying the thermal treatment by conduction.

10. The method of claim 1, further comprising co-depositing the first material and a second material to form a graded material layer.

11. The method of claim 1, further comprising:
depositing a second material on at least a portion of the first material to form a second material layer; and
applying the thermal treatment before completion of the deposition of the second material.

12. A method for manufacturing a photomask blank, comprising:
depositing at least one material on at least a portion of a substrate using ion beam deposition to form at least one material layer; and
applying a thermal treatment to the substrate at a temperature greater than approximately 300 degrees Celsius during deposition of the material, the thermal treatment operable to reduce stress in the material layer.

13. The method of claim 12, further comprising the thermal treatment operable to reduce contaminants deposited on the substrate during the deposition process.

14. The method of claim 12, further comprising applying the thermal treatment by radiation.

15. The method of claim 12, further comprising applying the thermal treatment by convection.

16. The method of claim 12, further comprising applying the thermal treatment by conduction.

17. The method of claim 12, further comprising:
sequentially depositing a plurality of materials on at least a portion of the substrate to form a plurality of material layers; and
applying the thermal treatment to the substrate during the deposition of each of the materials.

18. A photomask, comprising:
a substrate; and
a thermally-treated patterned layer formed on at least a portion of the substrate using ion beam deposition, the patterned layer formed by:
depositing a material on at least a portion of the substrate to form a material layer;
applying a thermal treatment to the substrate at a temperature greater than approximately 300 degrees Celsius before completing the deposition of the material; and
forming a pattern in the material layer to create the patterned layer;
wherein an intrinsic stress of the patterned layer is reduced due to the thermal treatment applied to the substrate.

19. The photomask of claim 18, further comprising the thermal treatment operable to reduce contaminants deposited on the substrate during deposition of the material.

20. The photomask of claim 18, further comprising:
sequentially depositing a plurality of materials on at least a portion of the substrate to form a plurality of patterned layers; and
applying the thermal treatment to the substrate during the deposition of each of the materials.

21. A photomask assembly, comprising:
a pellicle assembly defined in part by a pellicle frame and a pellicle film attached thereto; and
a photomask coupled to the pellicle assembly opposite from the pellicle film, the photomask including a thermally-treated patterned layer formed on a substrate using ion beam deposition, the patterned layer formed by:
depositing at least one material on at least a portion of a substrate to form a material layer;
applying a thermal treatment at a temperature greater than approximately 300 degrees Celsius before completing the deposition of the material; and
forming a pattern in the material layer to create the patterned layer;
wherein an intrinsic stress of the patterned layer is reduced due to the thermal treatment applied to the substrate.

22. The photomask assembly of claim 21, further comprising the thermal treatment operable to reduce contaminants deposited on the substrate during deposition of the material.

23. The photomask assembly of claim 21, wherein the photomask comprises a phase shift mask.

* * * * *